United States Patent
Fujisaki et al.

(10) Patent No.: US 11,024,485 B2
(45) Date of Patent: Jun. 1, 2021

(54) MULTI-CHARGED-PARTICLE-BEAM WRITING APPARATUS AND BEAM EVALUATING METHOD FOR THE SAME

(71) Applicant: NuFlare Technology, Inc., Yokohama (JP)

(72) Inventors: Eita Fujisaki, Yokohama (JP); Osamu Iizuka, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/431,906

(22) Filed: Jun. 5, 2019

(65) Prior Publication Data

US 2019/0385812 A1 Dec. 19, 2019

(30) Foreign Application Priority Data

Jun. 19, 2018 (JP) .............................. JP2018-116294

(51) Int. Cl.
| | | |
|---|---|---|
| *H01J 37/317* | (2006.01) | |
| *H01J 37/30* | (2006.01) | |
| *H01J 37/304* | (2006.01) | |

(52) U.S. Cl.
CPC ...... *H01J 37/3177* (2013.01); *H01J 37/3002* (2013.01); *H01J 37/3045* (2013.01); *H01J 2237/31774* (2013.01)

(58) Field of Classification Search
CPC .... H01J 37/30; H01J 37/3002; H01J 37/3026; H01J 37/3174; H01J 37/3177

(Continued)

(56) References Cited

U.S. PATENT DOCUMENTS

| 5,825,034 A | 10/1998 | Tamura |
| 2007/0216767 A1 | 9/2007 | Kojima |

(Continued)

FOREIGN PATENT DOCUMENTS

| JP | 07-065760 | 3/1995 |
| JP | 10-064794 | 3/1998 |

(Continued)

OTHER PUBLICATIONS

Taiwanese Office Action dated Mar. 10, 2020 in Taiwanese Patent Application No. 108116142 (with unedited computer generated English translation), 12 pages.

(Continued)

*Primary Examiner* — Jason L McCormack
(74) *Attorney, Agent, or Firm* — Oblon, McClelland, Maier & Neustadt, L.L.P.

(57) ABSTRACT

In one embodiment, a multi-charged-particle-beam writing apparatus includes a shaping aperture array plate including a plurality of first apertures through which a charged particle beam passes to form multiple beams, a movable stage on which a writing target substrate is placed, an inspection aperture plate disposed on the stage, the inspection aperture plate including a second aperture through which one of the multiple beams passes, a current detector detecting a current of the beam that has passed through the second aperture of the inspection aperture plate, a deflector deflecting the multiple beams, the deflector controlling deflection of one of the multiple beams such that the one beam is located at a predetermined position in a region including the second aperture and a surrounding region of the second aperture, and a calculator obtaining a beam position based on the beam current detected by the current detector.

8 Claims, 6 Drawing Sheets

(58) Field of Classification Search
USPC .................. 250/396 R, 492.1, 492.22, 492.3
See application file for complete search history.

(56) References Cited

U.S. PATENT DOCUMENTS

2018/0138013 A1* 5/2018 Iizuka ................... H01J 37/147
2018/0166248 A1* 6/2018 Ogasawara ............... G03F 7/20
2018/0350552 A1* 12/2018 Morita ................... H01J 37/20

FOREIGN PATENT DOCUMENTS

| JP | H11-16815 | 1/1999 |
| KR | 10-2004-0076600 | 1/2004 |
| KR | 10-2018-0053226 | 5/2018 |
| TW | 201820027 A | 6/2018 |
| WO | WO 2005/121902 A1 | 12/2005 |

OTHER PUBLICATIONS

Office Action dated Jul. 16, 2020, in Korean Patent Application No. 10-2019-0070407, with English Machine Translation.
Office Action dated Jan. 18, 2021, in Korean Patent Application No. 10-2019-0070407, with English Machine Translation.

* cited by examiner

MULTI-CHARGED-PARTICLE-BEAM WRITING APPARATUS AND BEAM EVALUATING METHOD FOR THE SAME

CROSS REFERENCE TO RELATED APPLICATION

This application is based upon and claims benefit of priority from the Japanese Patent Application No. 2018-116294, filed on Jun. 19, 2018, the entire contents of which are incorporated herein by reference.

FIELD the present invention relates to a multi-charged-particle-beam writing apparatus and a beam evaluating method for the same.

BACKGROUND

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

A writing apparatus using multiple beams enables irradiation with many beams at a time, so the throughput of such a multi-beam writing apparatus can be more greatly increased than that in writing using a single electron beam. Examples of multi-beam writing apparatuses include a multi-beam writing apparatus including a blanking aperture array member. In such a multi-beam writing apparatus, for example, an electron beam emitted from a single electron gun passes through a plurality of apertures of a shaping aperture array member, thus forming multiple beams (electron beams). Each of the multiple beams passes through a corresponding one of blankers arranged in the blanking aperture array member. The blanking aperture array member includes pairs of electrodes for individually deflecting the beams and a beam passage aperture between each pair of electrodes. One of the pair of electrodes is held at ground potential, and the other one of the electrodes is switched between the ground potential and a potential other than the ground potential, thus achieving individual blanking deflection of the electron beam that is to pass through the blanker. The electron beam deflected by the blanker is blocked. The electron beam that has not been deflected is applied to a sample.

In a writing apparatus, an electron beam to be applied to a sample may vibrate (fluctuate). It is therefore necessary to measure vibration and evaluate the direction and cause of the vibration. In a typical single-beam writing apparatus, a beam is applied to a calibration mark disposed on a sample, electrons reflected from the mark are detected, and vibration of the electron beam is evaluated based on a change in intensity of the reflected electrons.

Multiple beams applied by a multi-beam writing apparatus are arranged at intervals. This means a large irradiation area. Unfortunately, the above-described method of detecting electrons reflected from a mark cannot be used for such a multi-beam writing apparatus. Although only one of the multiple beams is switched to an ON state and the mark can be scanned with the one beam, it is difficult to detect the intensity of electrons reflected from the mark because the intensity of the electrons reflected by using the one beam is very low.

DETAILED DESCRIPTION

In one embodiment, a multi-charged-particle-beam writing apparatus includes a shaping aperture array plate including a plurality of first apertures through which a charged particle beam passes to form multiple beams, a blanking aperture array plate including a plurality of blankers each switching a corresponding one of the multiple beams between an ON state and an OFF state, a movable stage on which a writing target substrate is placed, an inspection aperture plate disposed on the stage, the inspection aperture plate including a second aperture through which one of the multiple beams passes, a current detector detecting a current of the beam that has passed through the second aperture of the inspection aperture plate, a deflector deflecting the multiple beams, the deflector controlling deflection of one of the multiple beams such that the one beam is located at a predetermined position in a region including the second aperture and a surrounding region of the second aperture, and a calculator obtaining a beam position based on the beam current detected by the current detector.

Figure 1:
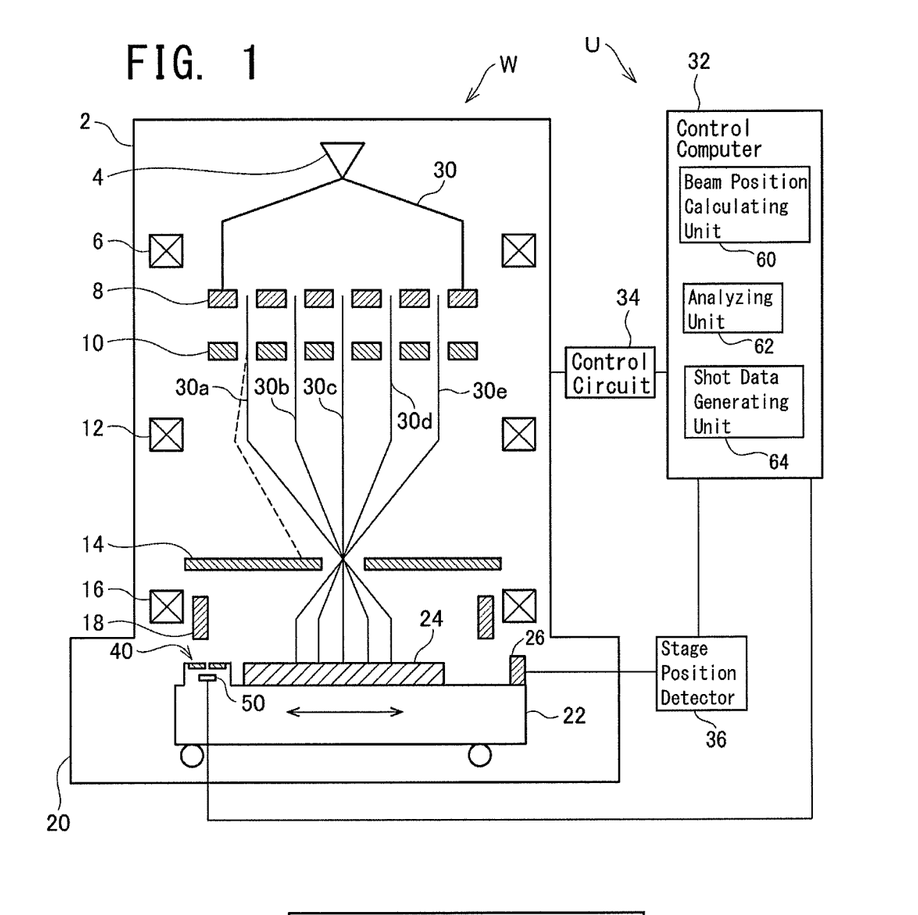
FIG. 1 is a schematic diagram of a writing apparatus according to an embodiment of the present invention.

FIG. 1 is a schematic diagram of a multi-charged-particle-beam writing apparatus according to an embodiment of the present invention. In the present embodiment, a configuration using an electron beam as an example of a charged particle beam will be described. The charged particle beam is not limited to the electron beam. Another charged particle beam, such as an ion beam, may be used.

This writing apparatus includes a writing unit W that applies electron beams to a writing target substrate 24 to write a desired pattern on the substrate and a control unit U that controls an operation of the writing unit W.

The writing unit W includes an electron beam optical column 2 and a writing chamber 20. The electron beam optical column 2 contains an electron gun 4, an illumination lens 6, a shaping aperture array plate 8, a blanking aperture array plate 10, a reduction lens 12, a limiting aperture plate 14, an objective lens 16, and a deflector 18.

The writing chamber 20 contains an XY stage 22. The writing target substrate 24 is placed on the XY stage 22. Examples of the substrate 24 include a wafer and an exposure mask.

A mirror 26 for measuring the position of the XY stage 22 is disposed on the XY stage 22. In addition, a beam inspection device for multiple beams is disposed on the XY stage 22 at a position different from a position at which the substrate 24 is placed. The beam inspection device includes a multi-beam inspection aperture plate 40 (hereinafter, referred to as an "inspection aperture plate 40") and a current detector 50. Preferably, the inspection aperture plate 40 is installed at the same level as the substrate 24.

Figure 2:
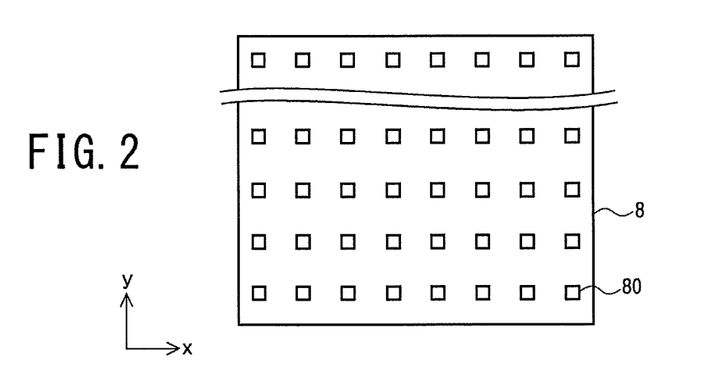
FIG. 2 is a schematic diagram of a shaping aperture array plate.

The electron gun 4 emits an electron beam 30. The illumination lens 6 causes the electron beam 30 to be applied substantially perpendicular to the entire shaping aperture array plate 8. FIG. 2 is a schematic diagram illustrating an exemplary configuration of the shaping aperture array plate 8. The shaping aperture array plate 8 has apertures 80 arranged in a matrix of m columns extending in a longitudinal direction (y direction) of the plate×n rows extending in a lateral direction (x direction) thereof (m, n≥2) at a predetermined pitch. For example, the shaping aperture array plate 8 has the apertures 80 arranged in a matrix of 512 columns×512 rows. The apertures 80 are rectangular and have the same dimensions. The apertures 80 may be circular and have the same diameter.

The electron beam 30 is applied to an area including all of the apertures 80 of the shaping aperture array plate 8. The electron beam 30 partially passes through these apertures 80, thus forming multiple beams 30a to 30e as illustrated in FIG. 1.

The blanking aperture array plate 10 has through-holes respectively aligned with the apertures 80 of the shaping aperture array plate 8. In each through-hole, a blanker including two paired electrodes is disposed. Each of the multiple beams 30a to 30e passing through the through-holes is independently deflected by a voltage applied by the blanker. This deflection achieves blanking control on the beams. The blanking aperture array plate 10 performs blanking deflection on each of the multiple beams that have passed through the apertures 80 of the shaping aperture array plate 8.

The multiple beams 30a to 30e that have passed through the blanking aperture array plate 10 are reduced in size and arrangement pitch by the reduction lens 12 and travel toward a central aperture of the limiting aperture plate 14. Electron beams deflected by the blankers of the blanking aperture array plate 10 are changed in trajectory, so that the electron beams are deviated from the central aperture of the limiting aperture plate 14 and are accordingly blocked by the limiting aperture plate 14. In contrast, electron beams that have not been deflected by the blankers of the blanking aperture array plate 10 pass through the central aperture of the limiting aperture plate 14.

The limiting aperture plate 14 blocks electron beams deflected in a beam OFF state by the blankers of the blanking aperture array plate 10. The beams passing through the limiting aperture plate 14 for a period between the time when the beams enter a beam ON state and the time when the beams are switched to the beam OFF state correspond to a one-time electron beam shot.

The multiple beams 30a to 30e that have passed through the limiting aperture plate 14 are focused by the objective lens 16, thus forming a pattern image reduced at a desired reduction ratio on the substrate 24. The electron beams (multiple beams) that have passed through the limiting aperture plate 14 are deflected together in the same direction by the deflector 18 and are then applied to the substrate 24.

While the XY stage 22 is continuously moved, the deflector 18 performs tracking control such that beam writing positions (irradiation positions) follow the movement of the XY stage 22. The position of the XY stage 22 is measured by using reflected light, which is obtained by irradiating the mirror 26 on the XY stage 22 with laser light emitted from a stage position detector 36.

The multiple beams applied at a time are ideally arranged at a pitch obtained by multiplying the arrangement pitch of the apertures 80 of the shaping aperture array plate 8 by the above-described desired reduction ratio. The writing apparatus performs a writing operation in a raster scanning manner such that beam shots are successively and sequentially applied. To write a desired pattern, the blanking control causes beams necessary for the pattern to enter the beam ON state.

The control unit U includes a control computer 32 and a control circuit 34. The control computer 32 (calculator) includes a beam position calculating unit 60, an analyzing unit 62, and a shot data generating unit 64. These units of the control computer 32 may be implemented by hardware, such as electric circuitry, or software, such as a program that achieves functions of the units. If the units are implemented by software, a program that achieves the functions of the units may be stored in a recording medium and a computer including electric circuitry may be caused to read and execute the program.

The shot data generating unit 64 reads write data stored in a memory (not illustrated), performs multi-stage data conversion on the write data to generate shot data specific to the apparatus, and outputs the generated data to the control circuit 34. In the write data, for example, arrangement positions of figure patterns, the types of figures, and the dimensions of the figures are defined. In the shot data, for example, a dose for each shot and the coordinates of irradiation positions for the shot are defined. The control circuit 34 divides a dose for each shot by a current density to obtain irradiation time t. To achieve each shot, the control circuit 34 applies a deflection voltage to the blankers associated with the shot in the blanking aperture array plate 10 so that beams corresponding to the blankers are in the beam ON state only for the irradiation time t.

The control circuit 34 computes the amount of deflection so that each beam is deflected to the position (coordinates) indicated by the shot data, and applies a deflection voltage to the deflector 18. Consequently, the multiple beams to be applied at the same time are deflected together.

In the writing apparatus with such a configuration, a writing process requires beam vibration measurement. In this embodiment, the inspection device including the inspection aperture plate 40 and the current detector 50 is used for beam vibration measurement.

Figure 3A:
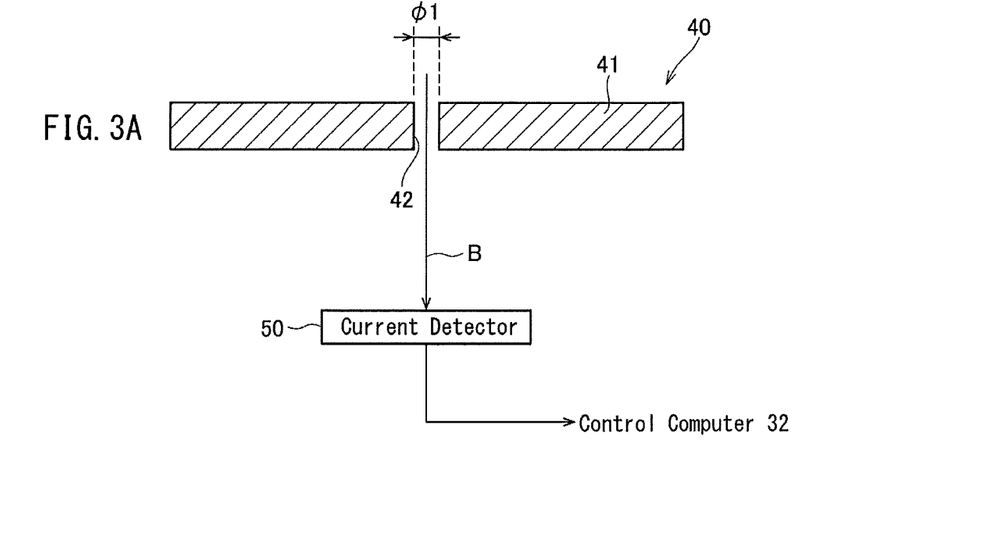
FIG. 3A is a schematic diagram of a beam inspection device in the embodiment and FIG. 3B is a plan view of an inspection aperture plate.
Figure 3B:
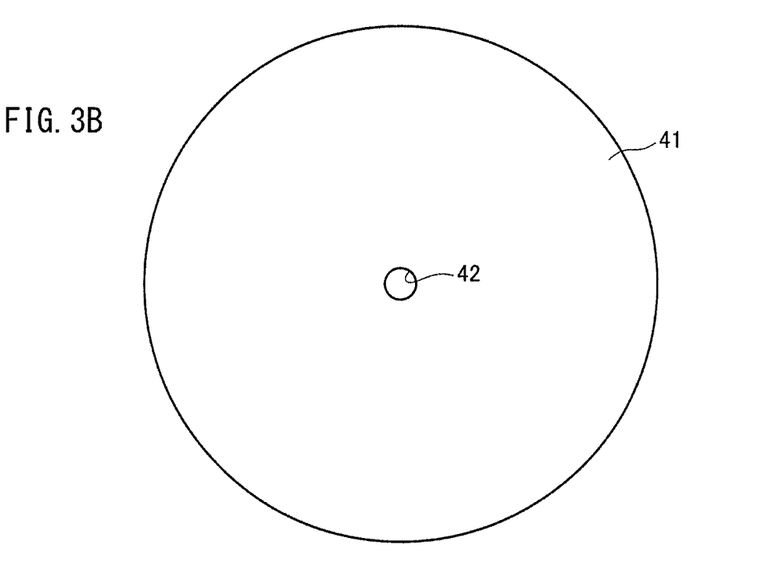

FIG. 3A is a schematic diagram illustrating an exemplary configuration of the inspection device. FIG. 3B is a plan view of the inspection aperture plate 40. The inspection aperture plate 40 is, for example, a circular, flat plate 41. The plate 41 has in its central part an aperture 42 extending through the plate 41. The plate 41 is made of, for example, heavy metal, such as Pt or W.

Preferably, the diameter, indicated at Ø1, of the aperture 42 is S<Ø1<C−S, where C denotes the beam pitch of the multiple beams on the substrate 24 and S denotes the beam size (of one beam). For example, the beam size S is set to 10 nm, the beam pitch C is set to 160 nm, and the diameter Ø1 is set to 100 nm.

A diameter Ø1 greater than the beam size S allows the whole of one electron beam to pass through the aperture 42 (scattering-free transmission), leading to an increase in S/N ratio. The diameter Ø1 is preferably as large as possible so that a beam can be easily found and such a through-hole is not blocked by foreign matter.

In contrast, a diameter Ø1 less than C−S prevents (part of) two adjacent beams from simultaneously passing through the aperture 42 during scanning of the multiple beams. Therefore, the aperture 42 permits only one electron beam of the multiple beams to pass through the aperture 42, or can block the other beams.

The electron beam that has passed through the aperture 42 impinges on the current detector 50, by which a beam current is detected. Examples of the current detector 50 usable herein include a solid-state detector (SSD). Data indicating a detection result of the current detector 50 is sent to the control computer 32.

Figure 4:
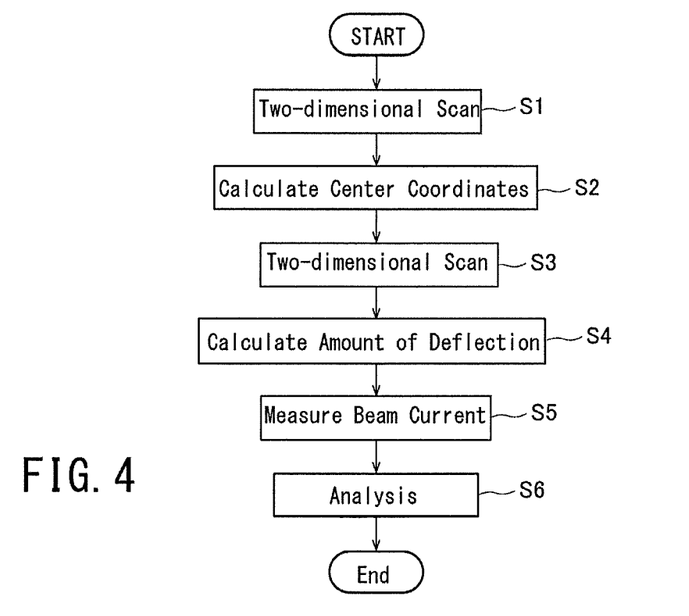
FIG. 4 is a flowchart illustrating a method of measuring and evaluating beam vibration.

A method of measuring and evaluating beam vibration will now be described with reference to a flowchart of FIG. 4.

The blankers of the blanking aperture array plate 10 are operated such that some (or all) of the beams enter the ON state, the beams are deflected in two-dimensional directions, or x and y directions, by using the deflector 18, and the beams are scanned over the inspection aperture plate 40 (step S1). The current detector 50 detects beam currents.

Figure 5:
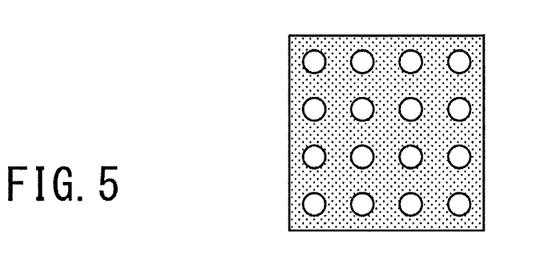
FIG. 5 is a diagram illustrating an exemplary beam image.

The control computer 32 converts the beam currents detected by the current detector 50 into intensities, and produces a beam image based on the amounts of deflection by the deflector 18. For example, a beam image is produced as illustrated in FIG. 5, which depicts an exemplary image obtained by scanning a 4×4 array of beams in the ON state over the inspection aperture plate 40. The control computer 32 identifies a beam array based on the beam image.

The beam position calculating unit 60 calculates the positions of the beams in a beam array region and the coordinates of the center of the beam array on the basis of the position of the stage detected by the stage position detector 36 (step S2).

Figure 6A:
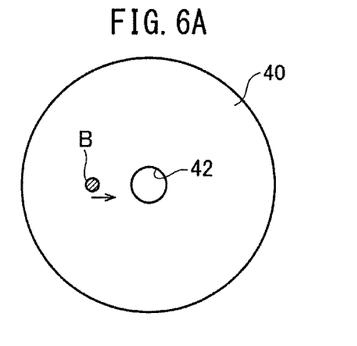
FIG. 6A is a diagram illustrating exemplary beam scanning and FIG. 6B is a graph showing detected beam currents.

One of the beams that have entered the ON state in step S1 is one-dimensionally scanned in the x direction such that the beam crosses over the edge of the aperture 42 (step S3). For example, as illustrated in FIG. 6A, a beam B is aligned with the aperture 42 in the y direction and is scanned in the x direction. The beam B is a target beam for beam vibration measurement.

Figure 6B:
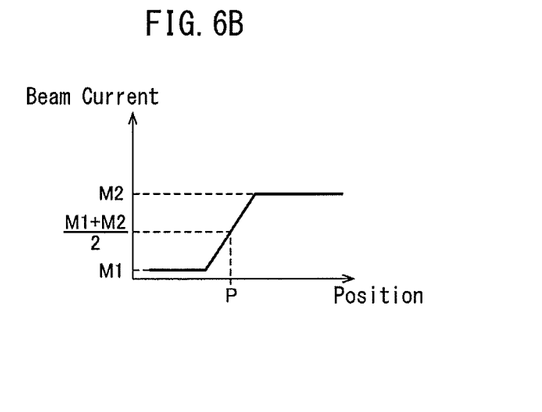

FIG. 6B is a graph showing beam currents detected by the current detector 50 during scanning of the beam. While the beam B is blocked by the inspection aperture plate 40, a detection value M1 is extremely low (almost zero). As the beam B starts to pass through the aperture 42, the detection value gradually increases. While the whole of the beam B passes through the aperture 42, a detection value M2 is constant.

The beam position calculating unit 60 calculates the amount of deflection required to deflect the beam B to a position P, at which a beam current indicates an intermediate value ((M1+M2)/2) between the values M1 and M2 (step S4). At this position, as illustrated in FIG. 7A, one half (hatched part in FIG. 7A) of the beam B in the x direction is located on the edge of the aperture 42 and is blocked by the inspection aperture plate 40, and the other half thereof passes through the aperture 42.

Similarly, the beam B is one-dimensionally scanned in the y direction such that the beam crosses over the edge of the aperture 42. Detected beam currents are used to calculate the amount of deflection required to deflect the beam B to a position at which, as illustrated in FIG. 7B, one half (hatched part in FIG. 7B) of the beam B in the y direction is located on the edge of the aperture 42 and is blocked by the inspection aperture plate 40 and the other half thereof passes through the aperture 42.

Figure 8:
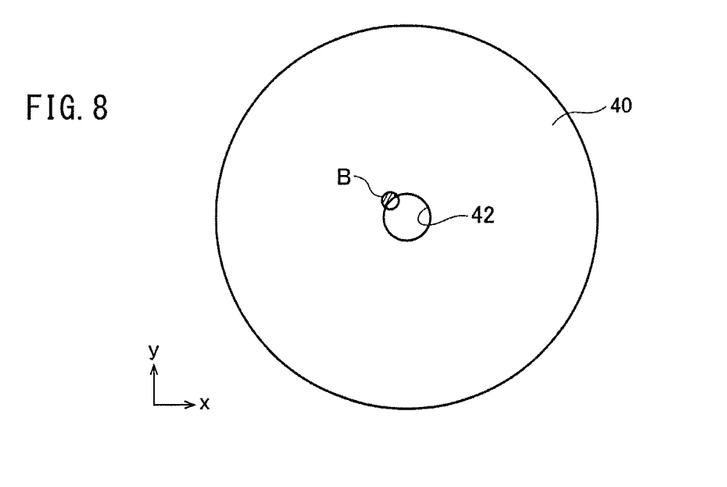
FIG. 8 is a diagram illustrating a beam deflection position in beam vibration measurement.

As illustrated in FIG. 8, the beam B may be scanned in a direction at an angle of 45° with respect to the x direction and the y direction, and the amount of deflection required to deflect the beam B to a position at which the beam B overlaps the edge of the aperture 42 may be calculated.

Figure 7A:
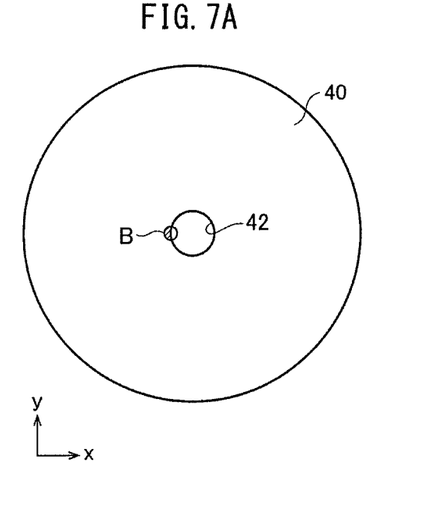
FIGS. 7A and 7B are diagrams illustrating beam deflection positions in beam vibration measurement.
Figure 7B:
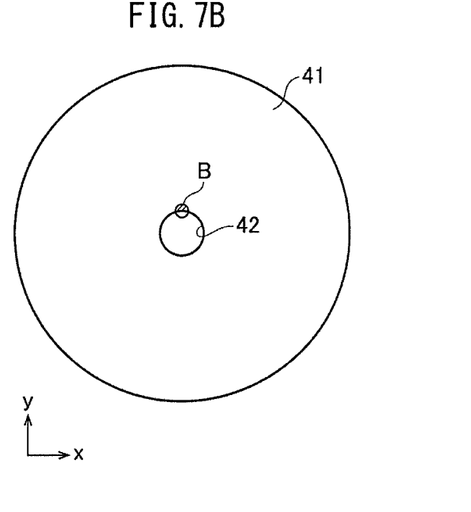

The beam B is kept for a given period of time at each of the position at which the whole of the beam B passes through the aperture 42, the position at which the whole of the beam B is blocked by the inspection aperture plate 40, and the positions illustrated in FIGS. 7A and 7B. The current detector 50 detects and measures a beam current at each of the positions (step S5). The analyzing unit 62 analyzes the detected beam currents and calculates vibration of the beam (step S6).

For example, the beam current detected at the position at which, as illustrated in FIG. 7A, one half of the beam B in the x direction is blocked by the inspection aperture plate 40 and the other half thereof passes through the aperture 42 is markedly affected by vibration of the beam B in the x direction. For example, vibration of the beam B in the y direction at this position causes little change in detected beam current, whereas vibration of the beam B in the x direction at this position causes a (large) change in detected beam current.

The beam current detected at the positon at which, as illustrated in FIG. 7B, one half of the beam B in the y direction is blocked by the inspection aperture plate 40 and the other half thereof passes through the aperture 42 is markedly affected by vibration of the beam B in the y direction. For example, vibration of the beam B in the x direction at this position causes little change in detected beam current, whereas vibration of the beam B in the y direction at this position causes a (large) change in detected beam current.

The beam current detected at the position at which the whole of the beam B passes through the aperture 42 is markedly affected by fluctuations in output intensity of the electron beam emitted from the electron gun 4.

The beam current detected at the position at which the whole of the beam B is blocked by the inspection aperture plate 40 is markedly affected by background noise.

The analyzing unit 62 subtracts the fluctuations in output intensity of the electron beam and the background noise from the beam current detected at the position illustrated in FIG. 7A to calculate an amount of vibration at the position of the beam in the x direction. For example, the analyzing unit 62 performs fast Fourier transformation (FFT) on the detected beam current to analyze a frequency characteristic of vibration of the beam in the x direction.

Similarly, the analyzing unit 62 subtracts the fluctuations in output intensity of the electron beam and the background noise from the beam current detected at the position illustrated in FIG. 7B to calculate an amount of vibration at the position of the beam in the y direction. For example, the analyzing unit 62 performs FFT on the detected beam current to analyze a frequency characteristic of vibration of the beam in the y direction.

As described above, one electron beam is deflected to a position at which the beam is partially blocked by the inspection aperture plate 40 and a beam current of part that has passed through the aperture 42 is detected, so that beam vibration can be evaluated based on the detected beam current.

Figure 9A:
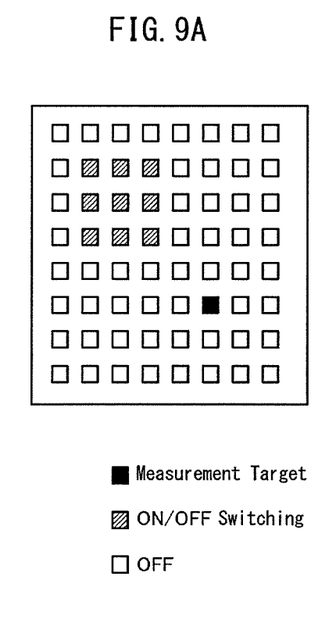
FIGS. 9A to 9C are diagrams illustrating measurement target beams and regions of beams switched between ON and OFF states.
Figure 9B:
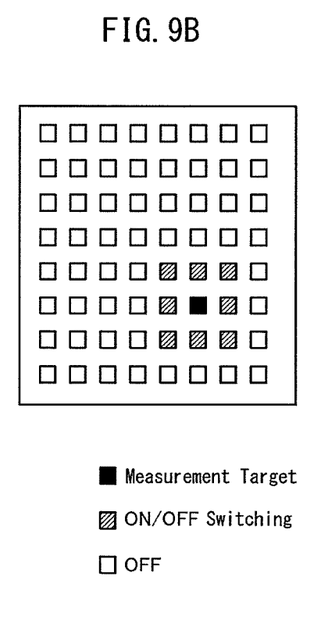
Figure 9C:
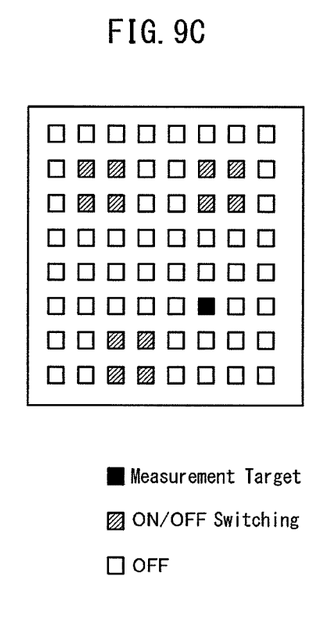
Figure 10A:
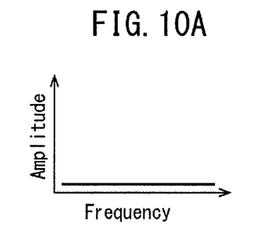
FIGS. 10A to 10C are graphs showing frequency characteristics calculated by performing fast Fourier transform (FFT) on detected beam currents.
Figure 10B:
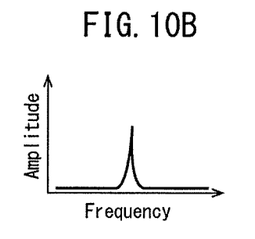
Figure 10C:
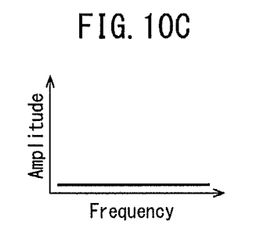

While a measurement target beam is scanned such that the beam overlaps the aperture 42 and currents of the beam are detected, beams in another region may be switched between the ON and OFF states at a predetermined frequency to measure crosstalk noise. FIGS. 9A to 9C illustrate exemplary measurement target beams (solid parts in FIGS. 9A to 9C) and exemplary beams (hatched parts in FIGS. 9A to 9C) switched between the ON and OFF states. FIG. 10A illustrates an exemplary result obtained by performing FFT on detected beam currents in FIG. 9A. FIGS. 10B and 10C correspond to FIGS. 9B and 9C, respectively.

If a peak frequency in FIG. 10B is identical to the frequency at which the beams are switched between the ON and OFF states, it demonstrates that noise caused by operations of the blankers surrounding the blanker for deflecting the measurement target beam is likely picked up. In FIGS. 10A and 10C, no peak appears. It demonstrates that the operations of the blankers for switching the beams between the ON and OFF states in FIGS. 9A and 9C have no influence.

Figure 11A:
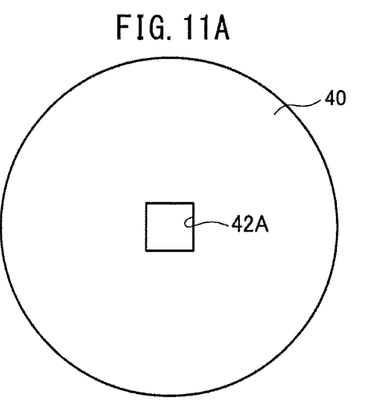
FIGS. 11A and 11B are diagrams illustrating exemplary shapes of apertures for the inspection aperture plate.
Figure 11B:
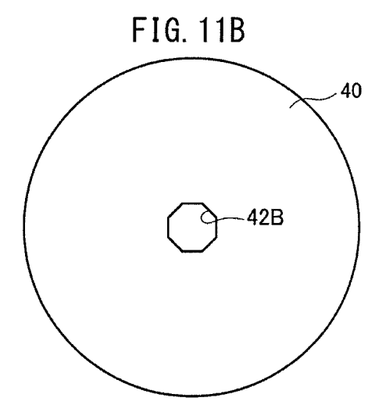

Although the above-described embodiment has been described with respect to an example in which the aperture 42 of the inspection aperture plate 40 is circular, the inspection aperture plate 40 may have a rectangular aperture 42A as illustrated in FIG. 11A. Furthermore, the inspection aperture plate 40 may have a polygonal aperture. FIG. 11B illustrates an octagonal aperture 42B.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi-charged-particle-beam writing apparatus comprising:
   a shaping aperture array plate including a plurality of first apertures through which a charged particle beam passes to form multiple beams;
   a blanking aperture array plate including a plurality of blankers each switching a corresponding one of the multiple beams between an ON state and an OFF state;
   a movable stage on which a writing target substrate is placed;
   an inspection aperture plate disposed on the stage, the inspection aperture plate including a second aperture through which one of the multiple beams passes;
   a current detector detecting a current of the beam that has passed through the second aperture of the inspection aperture plate;
   a deflector deflecting the multiple beams, the deflector controlling deflection of one of the multiple beams such that the one beam is located at a predetermined position in a region including the second aperture and a surrounding region of the second aperture, wherein the predetermined position is a position at which a first part of the one beam is blocked by an edge of the second aperture and a second part of the one beam passes through the second aperture; and
   the current detector detecting a current of the second part of the one beam that has passed through the second aperture; and further comprising
   a calculator obtaining a beam position based on the beam current detected by the current detector and calculating vibration of the one beam based on a detection result of the current detector.

2. The apparatus according to claim 1, wherein the predetermined position includes a position at which one half of the one beam in a first direction is blocked by the edge of the second aperture and a position at which one half of the one beam in a second direction orthogonal to the first direction is blocked by the edge of the second aperture.

3. The apparatus according to claim 1, wherein the predetermined position includes a position at which the one beam completely passes through the second aperture and a position at which the one beam is completely blocked by the inspection aperture plate.

4. The apparatus according to claim 1, wherein the deflector controls deflection of the one beam to scan the region in a predetermined direction.

5. A multi-charged-particle-beam writing apparatus comprising:
   a shaping aperture array plate including a plurality of first apertures through which a charged particle beam passes to form multiple beams;
   a blanking aperture array plate including a plurality of blankers each switching a corresponding one of the multiple beams between an ON state and OFF state;
   a movable stage on which a writing target substrate is placed;
   an inspection aperture plate disposed on the stage, the inspection aperture plate including a second aperture through which one of the multiple beams passes;
   a current detector detecting a current of the beam a has passed through the second aperture of the inspection aperture plate;
   a deflector deflecting the multiple beams, the deflector controlling deflection of one of the multiple beams such that the one beam is located at a predetermined position in a region including the second aperture and a surrounding region of the second aperture; and
   a calculator obtaining a beam position based on the beam current detected by the current detector,
   wherein the blanking aperture array plate switches beams different from the one beam between the ON and OFF states at a predetermined frequency,
   wherein the deflector controls deflection of the one beam to a predetermined position on the second aperture, and
   wherein the calculator determines, based on currents detected by the current detector, whether the currents contain noise associated with the predetermined frequency.

6. The apparatus according to claim 1, wherein the second aperture has a diameter $\varnothing 1$ that satisfies $S < \varnothing 1 < C - S$, where C denotes the beam pitch of the multiple beams and S denotes the size of the one beam.

7. A beam evaluating method for a multi-charged-particle-beam writing apparatus, the method comprising:
   emitting a charged particle beam;

causing the charged particle beam to pass through a plurality of first apertures arranged in a shaping aperture plate to form multiple beams;

switching, using each of a plurality of blinkers, a corresponding one of the multiple beams between an ON state and an OFF state;

controlling deflection of one of the multiple beams to a predetermined position on a second aperture that is provided in an inspection aperture plate on a stage on which a writing target substrate is placed and that allows passage of the one beam, wherein the predetermined position is a position at which a first part of the one beam is blocked by an edge of the second aperture and a second part of the one beam passes through the second aperture;

detecting a current of the second part of the one beam the beam that has passed through the second aperture; and calculating vibration of the one beam based on a detection result of the current of the second part of the one beam.

8. The method according to claim 7, wherein a first detection result indicates a current of the one beam partially blocked by the edge of the second aperture, a second detection result indicates a current of the one beam that has completely passed through the second aperture, a third detection result indicates a current of the one beam completely blocked by the inspection aperture plate, and the second and third detection results are subtracted from the first detection result to analyze a frequency characteristic of vibration of the beam.

* * * * *